(12) United States Patent
Jennings et al.

(10) Patent No.: US 7,812,642 B1
(45) Date of Patent: Oct. 12, 2010

(54) PASS GATE WITH IMPROVED LATCHUP IMMUNITY

(75) Inventors: John K. Jennings, Dublin (IE); James Karp, Saratoga, CA (US); Vassili Kireev, Sunnyvale, CA (US); Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/464,675

(22) Filed: May 12, 2009

(51) Int. Cl.
*H03K 19/20* (2006.01)
(52) U.S. Cl. .......................... 326/113; 326/31
(58) Field of Classification Search ......... 326/112–114, 326/30–31, 33–34
See application file for complete search history.

(56) References Cited

U.S. PATENT DOCUMENTS

| | | | |
|---|---|---|---|
| 5,880,620 A * | 3/1999 | Gitlin et al. ................. | 327/534 |
| 6,965,263 B2 * | 11/2005 | Bringivijayaraghavan ... | 327/537 |
| 7,355,437 B2 | 4/2008 | Perisetty | |
| 7,417,909 B2 | 8/2008 | Byeon et al. | |
| 7,446,991 B2 | 11/2008 | Chen | |
| 7,501,852 B2 * | 3/2009 | Suzuki et al. ................. | 326/33 |
| 2008/0188045 A1 | 8/2008 | Morris | |

\* cited by examiner

*Primary Examiner*—James Cho
(74) *Attorney, Agent, or Firm*—Scott Hewett; Lois D. Cartier

(57) ABSTRACT

An integrated circuit includes a pass gate having an input and an output. An NMOS pass transistor is connected between the input and the output. The drain of the NMOS pass transistor is connected to the input and the source of the NMOS pass transistor is connected to a node between the source of the NMOS transistor and the output of the pass gate. A current clamp is connected between the node and a current sink so as to conduct current to the current sink when the node reaches a threshold value.

19 Claims, 3 Drawing Sheets

PASS GATE WITH IMPROVED LATCHUP IMMUNITY

FIELD OF THE INVENTION

This invention relates generally to integrated circuits ("ICs"), and more particularly to techniques for reducing latch-up related to nmos pass gates connected to input/output pads.

BACKGROUND OF THE INVENTION

Many ICs are made up of millions of interconnected devices, such as transistors, resistors, capacitors, and diodes, on a single chip of semiconductor substrate. CMOS circuits and fabrication technology are commonly used in complex ICs. A necessary byproduct of the fabrication of a Bulk CMOS structure is a pair of parasitic bipolar junction transistors ("BJTs"). The collector of each BJT is connected to the base of the other transistor in a positive feedback structure. A phenomenon called latchup can occur when both BJT's conduct, creating a low resistance path between a voltage supply (e.g., $V_{CC}$) and GND and the product of the gains of these two transistors in the feedback loop is greater than one. Latchup causes a high amount of current to flow through the device once it has been triggered, and causes a circuit malfunction, and in some cases, destroys the associated MOS device by electrical over stress.

Latchup can occur due to transients, a noise spike, bouncing due to switching, or improper hook-up of the I/O pad in a circuit application. Since latchup can cause an IC to fail, latchup immunity is often tested by driving a current into an I/O pad during device test. I/O pads are of particular concern because they are accessible to the user, which means they may be exposed to transients or other events during use that the IC manufacturer cannot control. Some I/O pads are connected to a pass gate, which can be an NMOS pass gate or a CMOS pass gate.

Techniques for avoiding latchup related to nmos pass gates connected to I/O pads are desirable.

SUMMARY OF THE INVENTION

An integrated circuit includes a pass gate having an input and an output. An NMOS pass transistor is connected between the input and the output. The drain of the NMOS pass transistor is connected to the input and the source of the NMOS pass transistor is connected to a node (120) between the source of the NMOS pass transistor and the output. A current clamp is connected between the node and a current sink.

DETAILED DESCRIPTION

Figure 1A:
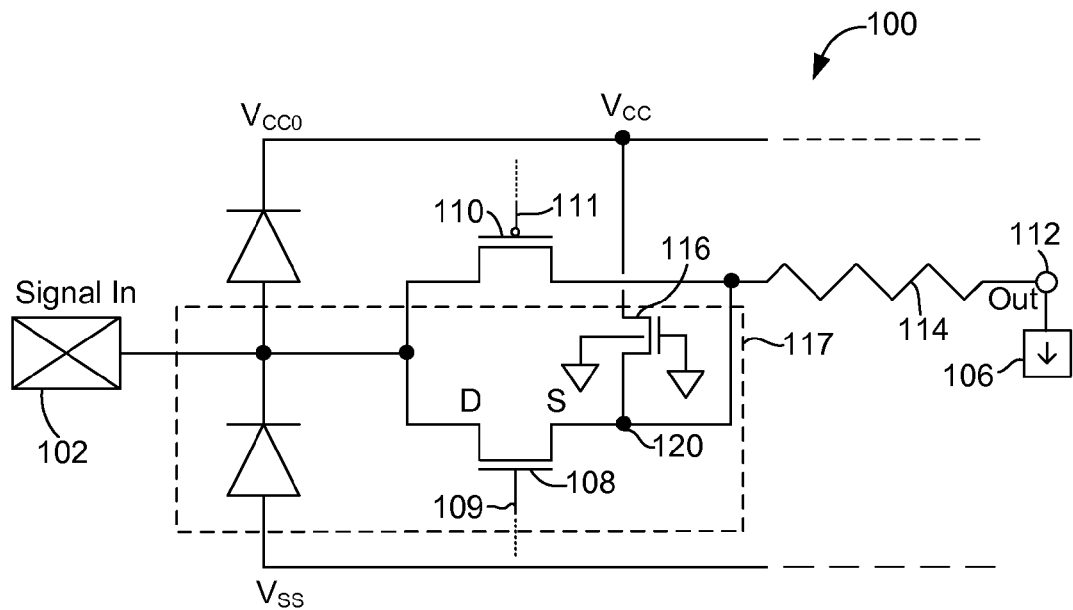
FIG. 1A is a circuit diagram of a CMOS pass gate in an IC according to an embodiment.

FIG. 1A is a circuit diagram of a CMOS pass gate 100 in an IC according to an embodiment. A signal, such as a test signal or an operating signal, is provided to the pass gate at an input pad 102. Embodiments of the invention are particularly desirable for use with internal nodes being connected to the pass gate as it allows for avoiding latchup without needing a guard ring around the pass gate, which are not effective with band-gap voltage sources and also saves circuit area. Alternative embodiments include guard rings. In an alternative embodiment, the input pad 102 is an I/O pad. I/O pads are particularly susceptible to latchup, as are circuit input pads (i.e., those pads that are user-accessible).

NMOS transistor 108 and PMOS transistor 110 form a CMOS pair and act as switches to couple the input pad 102 to the output 112 of the pass gate in response to pass signals 109, 111 generated elsewhere in the IC. The NMOS pass transistor 108 and current clamp 116 are formed in an N-well guard ring 117. Alternatively, the latching current clamp is a current mirror or other current clamping device. In an alternative embodiment, the ggNMOS pull-up transistor 116 is formed in a different well than the NMOS pass transistor 108.

The current clamp draws most of the current that would otherwise continue to a circuit element 106, such as a P-N diode or band-gap voltage reference, to a current sink, which in this case is $V_{CC}$.

The gg NMOS pull-up transistor 116 turns on when the voltage at the node 120 goes sufficiently negative to overcome the threshold voltage of the gg NMOS pull-up transistor. This can occur when the voltage at pad 102 goes sufficiently negative to turn on the NMOS pass transistor 108. The NMOS pass transistor 108 connects the node 120 to a negative voltage source under these conditions. The clamp 116 is placed between the NMOS pass transistor 108 and the current injection element 106.

For example, during an exemplary latchup test, −200 mA of current is forced into the input pad 102 for a few milliseconds. Depending on the dimensions of the circuit, −200 mA typically corresponds to between about −1.5 V to about −2.5V at the input pad 102. The NMOS pass transistor 108 becomes basically transparent to this negative voltage during the latchup test, and passes current that could cause latchup in the IC to node 120.

In a conventional pass gate without the current clamp 116, the negative current would be passed through to the output 112 of the pass gate and on to the current injection element 106. If the output of the pass gate is connected to an n-p junction device, such as an antenna diode or another transistor, the downstream device would then be negatively biased at about −1.5 V to about −2.5 V. This could lead to strong substrate current injection that triggers latchup and disqualification of IC when the devices are tested. Similarly, latchup of the IC during operation could occur if the input pad 102 goes sufficiently negative.

In the circuit of FIG. 1A, during the latchup test, the source S of the NMOS pass transistor 108 is negatively biased. The gg NMOS pull-up transistor 116 is turned on, and pulls up node 120 to about ground minus one threshold voltage, $V_{TH}$, of the pull-up transistor, which is typically about 0.4 V to about 0.5V. Although the source of the NMOS pass transistor (node 120) is still negative (i.e., at about negative $V_{TH}$), the amount of current injected from a downstream n-p junction as described above is greatly reduced. In one example, reducing the voltage at node 120 from between about −1.5V to about −2V down to between about −0.4V to about −0.5V reduces the injected current from dozens of milliamps to microamps.

At this very low level of current injected into the substrate, latchup triggering possibilities are practically eliminated.

An optional isolation resistor 114 directs residual injected current away from the current injection element 106 into the clamp 116. Generally, a higher isolation resistance provides superior latch-up immunity, but the maximum value is limited by practical considerations, such as output series resistance. Isolation resistors are typically between about 50 Ohms and about 500 Ohms, and in a particular embodiment, the isolation resistor is about 200 Ohms.

Figure 1B:
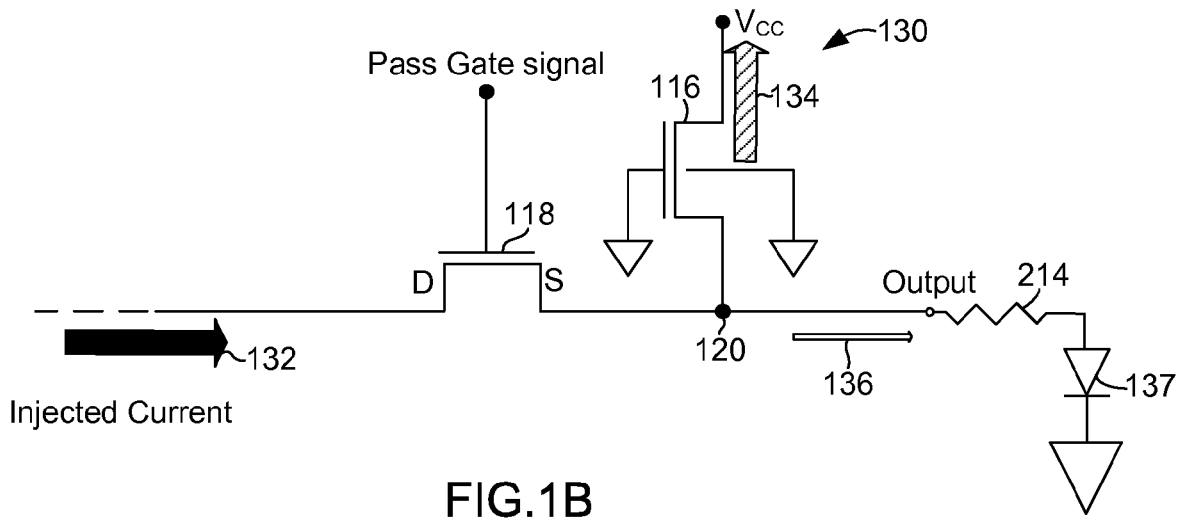
FIG. 1B is a circuit diagram of an NMOS pass gate and current clamp according to an alternative embodiment.

FIG. 1B is a circuit diagram of an NMOS pass gate 130 with a grounded-gate NMOS pull-up transistor 116 used as a current clamp. When the drain D of the NMOS pass transistor 118 goes to a sufficiently negative voltage, the NMOS pass transistor 118 becomes conductive and current ("injected current") 132 flows from the drain D to the source S of the NMOS pass transistor 118, bringing node 120 negative. When the negative voltage at node 120 exceeds $_{VTH}$, of the ggNMOS pull-up transistor 116, the ggNMOS pull-up transistor turns on and clamped current 134 flows through the ggNMOS pull-up transistor to the current sink $_{VCC}$. An optional bias resistor 114 is included between node 120 and a current injection element 137, which in a particular embodiment is an antenna diode of the IC. Other devices, such as the drain or source of a MOSFET could also inject current and potentially cause latchup. The small amount of injected current 136 continuing to the output of the pass gate 130 flows through the optional bias resistor 114, increasing the voltage difference between node 120 and the current sink $_{VCC}$, which is placed between the current injection element 137 and node 120. The terms "drain" and "source" are used solely for purposes of convenient discussion and illustration, as one of ordinary skill in the art of MOSFETs appreciates the nature of these terminals depends on circuit bias.

In this example, the injected current is negative current, i.e., the injected current lowers the voltage of the input node. This negative current (electron current) is represented by arrows flowing from the more negative potential to the more positive potential, as will be familiar to those of skill in the art as a convenient manner of illustration.

Figure 2:
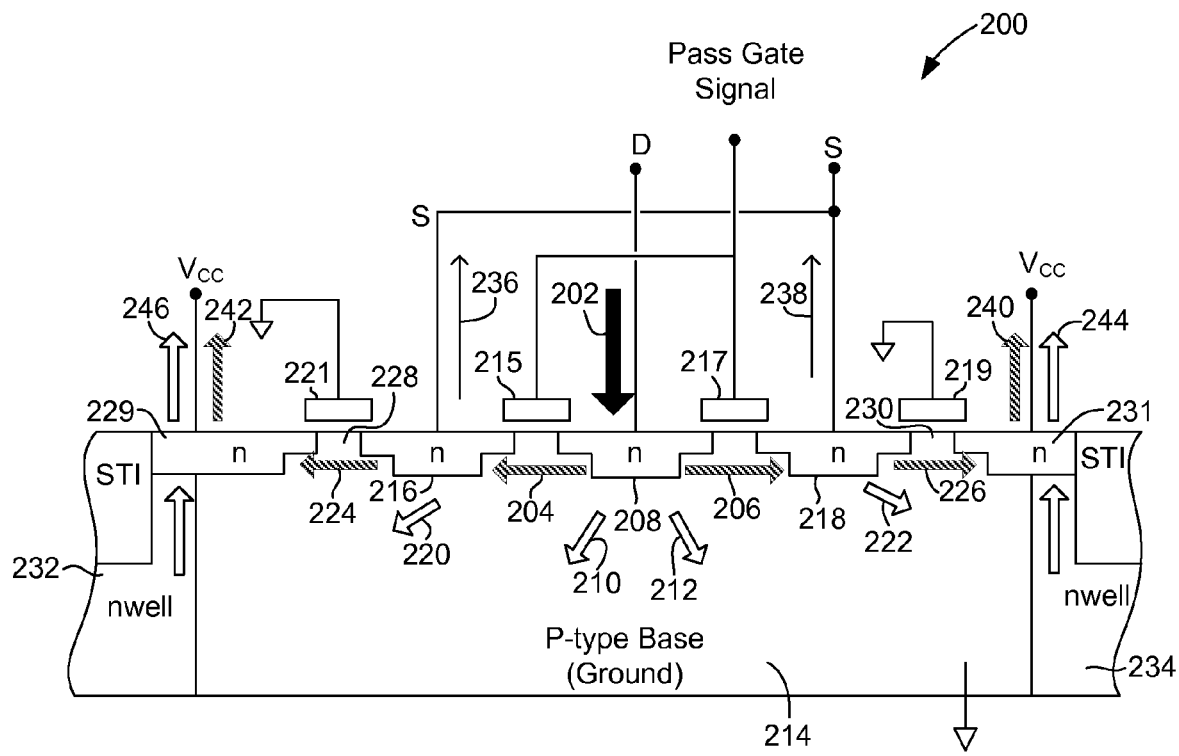
FIG. 2 is a diagram of a side view of a portion of a pass gate according to an embodiment illustrating MOS and bulk bipolar current flow.

FIG. 2 is a diagram of a side view of a portion of a pass gate 200 according to an embodiment illustrating MOS current flow and bulk current flow. The injected current 202 is negative current, as discussed above in relation to FIG. 1B, and is represented by arrows showing the direction of the injected current from a more negative potential to a less negative potential. The injected current 202 pulls the drain D of the NMOS pass transistor negative, and MOS current 204, 206 flows from the drain of the NMOS pass transistors to the sources S, S of the NMOS pass transistors. The drain of the NMOS pass transistors is connected to a pad, pin, or similar input terminal of the pass gate, and the sources S, S of the NMOS pass transistors are connected to an output terminal of the pass gate (see, e.g., FIG. 1A, ref. num. 112). In a particular embodiment, the output terminals of the pass gate are connected to a band-gap voltage ("$V_{BG}$") source or other internal voltage source of the IC. In a further embodiment, a bias resistor is in series between the sources of the NMOS pass transistors and the output terminal or between the output terminal and a current injection element (see, e.g., FIG. 1B, ref. nums. 114, 137)

The drain N region 208 of the NMOS pass transistors is forward biased with respect to the grounded P-type bulk silicon (substrate) 214 and injects bulk current 210, 212 into the P-type bulk silicon 214. The negatively biased source contacts 216, 218 of the NMOS pass transistors 215, 217 similarly inject bulk current 220, 222 into the bulk silicon substrate. MOS current 224, 226 is passed through the channels 228, 230 of the ggNMOS pull-up transistors 219, 221 and then to the drains 229, 231 of the ggNMOS pull-up transistors, which are integrated with the nwell and connected to $V_{CC}$. $V_{CC}$ is typically biased with a positive voltage of about 1V to about 3.3V. Other current sinks, such as without nwell 234 are used to sink the injected current in alternative embodiments.

The bulk current 210, 212, 220, 222 is collected by the nwell 232, 234, which is biased at $V_{CC}$ and is integrated with the drain of the gg NMOS pull-up transistor. Thus, both the MOS current (clamped current) and the bulk current components of the injected current are sunk to $V_{CC}$, with minor portions of injected current, represented by arrows 236, 238, flowing through the source terminals of the NMOS pass transistor to the output of the pass gate, and eventually to a downstream node or device. In a particular pass gate, about half the injected electron current sunk to $V_{CC}$ is MOS current (clamped current) 240, 242, and about half is bulk current 244, 246; however, this is merely exemplary, depending on device geometries, doping levels, and so forth.

The bulk current is generated from the p-n junctions formed in the substrate. The negatively biased portions of the n-type MOS devices inject electrons into the bulk p-type semiconductor, similar to how an emitter in a bipolar junction transistor ("BJT") injects current into a base region. The positively biased nwell collects the injected electrons, similar to a collector in a BJT.

Connecting the drains of the pull-up transistors and the nwell to $V_{CC}$, and providing the nwell in close physical proximity to the source(s) of the pass gate transistors, improves the efficiency of collecting the bulk injected electrons.

Figure 3:
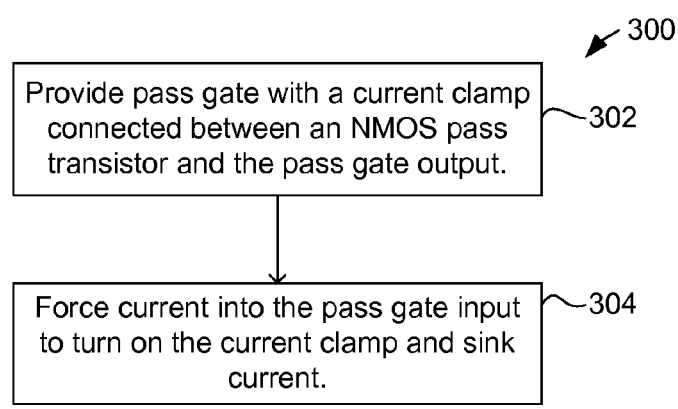
FIG. 3 is a flow chart of a method of testing an IC according to an embodiment.

FIG. 3 is a flow chart of a method of testing an IC 300 according to an embodiment. The IC has a pass gate with an input terminal and an output terminal, an NMOS pass transistor having a drain connected to the input terminal and a source coupled to the output terminal, and a current clamp, such as a ggNMOS pull-up transistor or current mirror, disposed between the source of the NMOS pass transistor and a current sink (step 302). A standard negative current, typically between about −100 mA and about −200 mA is forced into the input terminal. With all the rest IC pins are being pulled up high. In case of latchup high current is detected at power supply pins. If no latchup power supply pins does not show significant current increase. In a particular embodiment, the current clamp is a ggNMOS pull-up transistor, and the NMOS pass transistor and the ggNMOS pull-up transistor are fabricated in a common nwell with a drain terminal of the ggNMOS pull-up transistor connected to the nwell and to the current sink. In an alternative embodiment, the drain of the gg NMOS pull-up transistor is connected to a first current sink and the nwell is connected to a second current sink. In another embodiment, the NMOS pass transistor is fabricated in a first nwell, and the gg NMOS pull-up transistor is fabricated in a second nwell.

Figure 4:
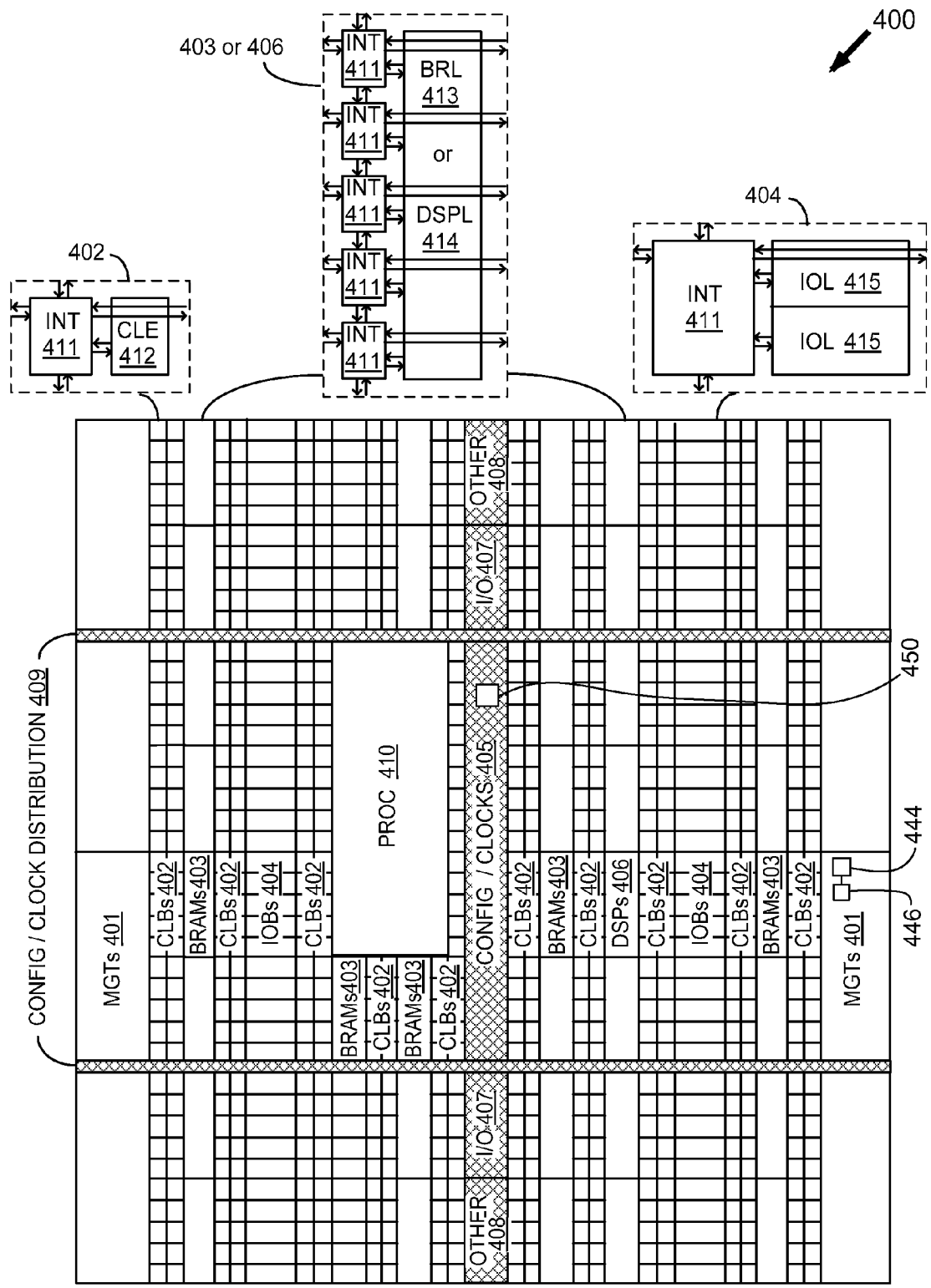
FIG. 4 is a plan view of an FPGA according to an embodiment.

FIG. 4 is a plan view of an FPGA 400 according to an embodiment. The FPGA is fabricated using a CMOS fabrication process and incorporates pass gates according to one or more embodiments of the invention in one or more functional blocks. For example, a pass gate 444 according to an embodiment is included in a transceiver block 401. In a further embodiment, the output of the pass gate 444 is connected to an antenna diode 446. The FPGA alternatively or additionally includes a pass gate according to an embodiment in a system monitor block 450 wherein the input of the pass gate is connected to a voltage reference, such as a band-gap voltage reference (not separately shown) or wherein the output of the pass gate (see, e.g., FIG. 1A, ref. num. 112) in a system monitor block is connected to a voltage reference, such as a band-gap voltage reference (not separately shown, see, e.g., FIG. 1A, ref. num. 106).

The FPGA architecture includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 can include a configurable logic element (CLE 412) that can be programmed to implement user logic plus a single programmable interconnect element (INT 411). A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element (INT 411). As will be clear to those of skill in the art, the actual I/O pads connected, for example, to the I/O logic element 415 are manufactured using metal layered above the various illustrated logic blocks, and typically are not confined to the area of the input/output logic element 415. In the pictured embodiment, a columnar area near the center of the die is used for configuration, clock, and other control logic.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts of unit cells, fuses, array cores, logic gates, and control devices and circuits could be alternatively used. Therefore, the spirit and scope of the appended claims should not be limited to the foregoing description.

The invention claimed is:

1. An integrated circuit ("IC") comprising:
   a pass gate having an input and an output, an NMOS pass transistor connected between the input and the output, a drain of the NMOS pass transistor connected to the input and a source of the NMOS pass transistor connected to a node between the source of the NMOS pass transistor and the output; and
   a current clamp connected between the node and a current sink so as to conduct current to the current sink when the node reaches a threshold value,
   wherein the current clamp comprises a grounded-gate NMOS pull-up transistor.

2. The IC of claim 1 wherein the NMOS pass transistor is fabricated within an nwell and the grounded-gate NMOS pull-up transistor is fabricated within the nwell.

3. The IC of claim 1 wherein a source of the grounded-gate NMOS pull-up transistor is connected to the source of the NMOS pass transistor.

4. The IC of claim 1 wherein the current sink is a positive voltage source of the IC.

5. The IC of claim 1 further comprising a voltage reference connected to the input of the pass gate.

6. The IC of claim 5 wherein the voltage reference is a band-gap voltage reference in a field-programmable gate array.

7. An integrated circuit ("IC") comprising:
   a pass gate having an input and an output, an NMOS pass transistor connected between the input and the output, a drain of the NMOS pass transistor connected to the input and a source of the NMOS pass transistor connected to a node between the source of the NMOS pass transistor and the output;
   a current clamp connected between the node and a current sink so as to conduct current to the current sink when the node reaches a threshold value; and
   a current injection element and a bias resistor connected between the node and the current injection element.

8. The IC of claim 7 wherein the bias resistor is between 50 Ohms and 500 Ohms.

9. The IC of claim 7 wherein the bias resistor is connected between the node and the output of the pass gate.

10. The IC of claim 7 wherein the current injection element is an antenna diode.

11. The IC of claim 10 wherein the IC is a field-programmable gate array and the antenna diode is in a transceiver block of the field programmable gate array.

12. An integrated circuit ("IC") comprising:
   a pass gate including
      a first contact region of a first NMOS pass transistor and a second NMOS pass transistor,
      a second contact region of the first NMOS pass transistor and a first grounded-gate NMOS pull-up transistor;
      a third contact region of the second NMOS pass transistor and a second grounded-gate NMOS pull-up transistor;
   an nwell electrically connected to a current sink of the IC;
   a fourth contact region of the first grounded-gate NMOS pull-up transistor connected to the nwell; and
   a fifth contact region of the second grounded-gate NMOS pull-up transistor connected to the nwell.

13. The IC of claim 12 wherein the second contact region forms a source contact region of the first NMOS transistor and a drain contact region of the first grounded-gate NMOS pull-up transistor.

14. The integrated circuit of claim 12 wherein the current sink is a positive voltage supply of the integrated circuit.

15. A method of testing an integrated circuit comprising a pass gate having an input and an output, an NMOS pass transistor connected between the input and the output, a drain of the NMOS pass transistor connected to the input and a source of the NMOS pass transistor connected to a node between the source of the NMOS pass transistor and the output; and a current clamp connected between the node and a current sink so as to conduct current to the current sink when the node reaches a threshold value, the method of testing comprising:

forcing a current into the input of the pass gate so as to negatively bias the drain of the NMOS pass transistor relative to the source of the NMOS pass transistor and conduct a portion of the current through the current clamp to the current sink.

16. The method of claim 15 wherein the drain of the NMOS pass transistor injects a bulk portion of the current into the substrate.

17. The method of claim 16 wherein the bulk portion of the current is collected by an nwell of the pass gate and conducted to the current sink.

18. The method of claim 17 wherein the current clamp is a grounded-gate NMOS pull-up transistor formed in the nwell and a MOS current portion of the current flows through the grounded-gate NMOS pull-up transistor to the current sink.

19. The method of claim 18 wherein a drain of the grounded-gate NMOS pull-up transistor is connected to the nwell of the pass gate, both the nwell and the drain of the grounded-gate NMOS pull-up transistor being electrically connected to a positive voltage supply of the integrated circuit.

* * * * *